United States Patent [19]

Chawla et al.

[11] Patent Number: 6,046,641
[45] Date of Patent: Apr. 4, 2000

[54] PARALLEL HV MOSFET HIGH POWER STABLE AMPLIFIER

[75] Inventors: Yogendra K. Chawla, Pittsford; Craig A. Covert, Rochester, both of N.Y.

[73] Assignee: ENI Technologies, Inc., Rochester, N.Y.

[21] Appl. No.: 09/121,136

[22] Filed: Jul. 22, 1998

[51] Int. Cl.[7] .................. H03F 3/16; H03F 3/26; H03F 3/14

[52] U.S. Cl. .................. 330/277; 330/269; 330/276; 330/307

[58] Field of Search .................. 330/264, 269, 330/276, 307, 277

[56] References Cited

U.S. PATENT DOCUMENTS

| | | | |
|---|---|---|---|
| 4,112,386 | 9/1978 | Everhart et al. | 330/265 |
| 4,524,328 | 6/1985 | Abou et al. | 330/253 |
| 4,531,101 | 7/1985 | Pecukonis | 330/307 |
| 4,647,867 | 3/1987 | Butler et al. | 330/269 |
| 4,667,144 | 5/1987 | Jones et al. | 323/271 |
| 4,797,630 | 1/1989 | Brown | 330/264 |
| 4,890,073 | 12/1989 | Flahenecker et al. | 331/55 |
| 5,187,580 | 2/1993 | Porter, Jr. et al. | 330/207 |
| 5,325,258 | 6/1994 | Choi et al. | 361/87 |
| 5,420,537 | 5/1995 | Weedon et al. | 330/251 |
| 5,629,648 | 5/1997 | Pratt | 330/289 |
| 5,657,218 | 8/1997 | Rilly et al. | 363/97 |
| 5,726,603 | 3/1998 | Chawla et al. | 330/269 |

FOREIGN PATENT DOCUMENTS

| | | |
|---|---|---|
| 2-640 | 6/1979 | European Pat. Off. . |
| 1-269305 | 10/1989 | Japan . |

*Primary Examiner*—Robert Pascal
*Assistant Examiner*—Patricia T. Nguyen
*Attorney, Agent, or Firm*—Bryan Cave LLP

[57] ABSTRACT

A high power grounded-drain source follower RF amplifier circuit employs a high voltage MOSFET. The RF signal at the input is applied with respect to ground via an isolation transformer whose secondary feeds the signal between gate and source. The output is taken from the source with respect to drain, which is grounded. A 13.56 MHz 3 KW power amplifier topology with isolated RF input drive for each MOSFET die uses a pair of kilowatt power transistors or KPTs, in which there are multiple large area MOSFET dies, with the drain regions of the dies being formed over a major portion of the die lower surface. The drain regions are in direct electrical and thermal contact with the conductive copper flange. The source and gate regions are formed on the dies away from the flat lower surface. One or more pairs of multi-chip KPTs can be configured to design stable 2.5 KW, 5 KW and 10 KW RF plasma generators at 13.56 MHz. The generators employ a low pass/high pass filter arrangement (diplexer) at the output for low harmonic distortion and dissipative harmonic termination. The terminated high pass filter reduces the gate-to-source differential RF voltage and protects the MOSFETS from damage.

33 Claims, 8 Drawing Sheets

PARALLEL HV MOSFET HIGH POWER STABLE AMPLIFIER

BACKGROUND OF THE INVENTION

This invention relates to high power RF amplifiers, such as those employed in semiconductor plasma processing applications. The invention is more specifically related to a high power amplifier that employs high voltage large-die kilowatt power transistors. The invention can also be applied to other RF applications, such as radio communications and induction heating.

In a typical RF plasma generator arrangement, a high power RF source produces an RF wave at a preset frequency, i.e., 13.56 MHz, and this is furnished along a power conduit to a plasma chamber. The RF power is also typically provided at a fixed, known impedance, e.g., 50 ohms. An RF drive signal is generated and fed to a power amplifier, which provides the RF wave at a desired power level, e.g., 1.25 KW, 2.5 KW, 5 KW, 10 KW, etc. Depending on the application, the wave can be provided at some other frequency, such as 2.0 MHz, 4.0 MHz, 27.12 MHz, or 40.68 MHz.

The conventional plasma generator RF power amplifiers have employed RF bipolar or RF MOSFET transistors, with operating voltages (i.e., $V_{CE}$ or $V_{DS}$) between 40 and 50 volts. These semiconductor devices have breakdown voltages ($V_{CEO}$ or $V_{DSS}$) between 100 and 150 volts. Bipolar transistors for these RF amplifiers are commercially available as Motorola MRF448, CSF Thomson TH430, GHz Technology S200, or Philips BLW 96, at a typical cost of about $50 apiece. A 2.5 KW amplifier typically employs eight push-pull pairs in corporate parallel, with one transistor for each of the forward phase and reverse phase sections of each push-pull pair (sixteen transistors total). The RF generators based on the low voltage RF bipolar or RF MOSFET transistors have achieved very good reliability and performance for plasma applications. A typical amplifier of this construction, operating at about 45 volts rail, is rather insensitive to the particular system set up, making it very user-friendly without significant equipment interface issues, such as the ability to ignite and sustain the plasma for a desired application.

Recently, there has been an interest among RF power amplifier designers to investigate the use of high voltage MOSFET transistors in place of the low voltage RF bipolar or RF MOSFET transistors. This has been described, for example, in U.S. Pat. No. 5,726,603, granted Mar. 10, 1998. The high voltage MOSFET transistors, originally intended for use in switch-mode power supplies, have high drain-source breakdown voltages $V_{DSS}$, low junction-to-case thermal resistance $R_{\theta JC}$, and a low drain-to-source on resistance $R_{DS-ON}$. These transistors can be formed as a rather large die, e.g., 100,000 square mils, with a high gain-bandwidth product $F_T$. These large dies are designed as large single chip transistors with a minimum of source and gate bond wires, unlike low voltage RF bipolar and MOSFET dies, which are designed as multiple small cells with large numbers of emitter (source) and base (gate) bond wires. The high voltage, large-die design makes the high voltage MOSFET transistor better suited for high volume production, which is required for the switch-mode market. This results in a lower packaged transistor cost, typically about $17 or less for a 1KV breakdown voltage ($V_{DSS}$) device in a standard TO-247 package. Amplifiers based on these devices can achieve a power gain of about 15 to 16 dB at 13.56 MHz at 350 watts power output for 160 volts DC operation. The actual stable gain into various VSWR loads depends on the circuit topology used, and can be in the range of 12 to 13 dB, depending upon the device manufacturer. The semiconductor plasma processing equipment industry is now demanding lower cost and much smaller size plasma generators, due to the small available footprint in their fabs, where fabrication space is now at a premium. High voltage MOSFETs with innovative circuit topologies, using surface mount technology and improved cooling methods, have been considered as presenting a possible solution to meet this challenge.

Any RF power amplifier is required to maintain or exceed the operational reliability of the existing equipment, i.e., the low voltage RF bipolar transistor based amplifier designs. Aside from the use of high voltage switching MOSFET transistors in switch-mode circuit topologies, the main possibility includes the use of high voltage switching MOSFET transistors with RF circuit topologies.

Within the past few years, improved high voltage MOSFET transistors have been developed for switch-mode power supply applications. The performance of these devices has improved steadily with respect to drain-source breakdown voltage $V_{DSS}$, drain to source on-state resistance $R_{DS-ON}$, junction-to-case thermal resistance $R_{\theta JC}$, total gate charge $Q_g$, and drain to source voltage rate of change dV/dt. The state of the art to date is represented by the background and disclosure in U.S. Pat. No. 5,726,603.

OBJECTS AND SUMMARY OF THE INVENTION

It is an object of this invention to provide a high power RF amplifier that avoids the drawbacks of the prior art, and delivers RF power from a compact and efficient package.

It is a more specific object to provide an RF power generator with superior heat sinking and energy delivery characteristics, so that the amplifier components can withstand the thermal stresses that are induced from the power cycling that is inherent in plasma application.

It is a specific object of this invention to achieve improved junction temperature for each die on a given multiple die transistor device.

It is another object of this invention to provide a high power transistor amplifier which achieves balanced push-pull operation and experiences superior thermal balance between the multiple transistor dies employed in the amplifier.

It is a more particular object of the invention to achieve improved junction temperature tracking between the dies on a given multiple-die transistor device.

It is another object to increase the power balance and thermal balance between transistor dies over a broad output power dynamic range and into a wide range of load voltage standing wave ratios (VSWRs).

According to an aspect of this invention, a high power push-pull RF amplifier is provided for amplifying RF power in a given frequency band. A drive signal is applied to an RF input terminal, and the amplified RF power wave is delivered at an RF output terminal. A power supply provides a DC source voltage ($-V_s$) for the multiple-die power transistors, i.e., first and second kilowatt power transistor devices, or KPTs. Each such KPT device has a thermally and electrically conductive flange, e.g., a heat-sunk and grounded copper plate, and a multi-chip array formed, for example, of four semiconductor dies. Each semiconductor die has a flat lower surface with a drain region formed over a majority of its lower surface, and source and gate regions formed respectively on portions of the die away from said flat lower surface. The drains of the dies are seated on the flange so that they are in direct thermal and electrical contact with the flange. Thus, the flange serves as drain terminal and as heat sink for the associated dies.

A first splitter (balun) means coupled to the RF input terminal splits an RF input drive signal into a forward phase portion that is fed to the first KPT and a reverse phase portion that is fed to the second KPT. A second splitter means divides up the forward phase portion of the drive signal into four isolated signals to be supplied to the gates of said first kilowatt power transistor device. A third splitter means divides up the reverse phase portion into four isolated signals for supplying to the respective gates of the second KPT. Each of the four semiconductor dies of said first KPT is configured with a respective gate-source input circuit that is RF coupled to an associated output of said second splitter means. This gate-source input circuit is DC isolated from the splitter means and from ground, so that it floats with respect to the flange (and drains) of the first KPT. Each semiconductor die of the second KPT likewise has a respective gate-source input circuit which is RF coupled to, and DC isolated from, its associated output of the third splitter means but is floating with respect to the flange of the second KPT. A combiner means has inputs coupled to the sources of said first and second KPTs for combining amplified RF outputs from them. The combiner means then supplies a combined output to the RF output terminal via an impedance matching transformer. The RF amplifier also includes filter means connecting the sources of the kilowatt power transistor devices to the supply of DC source voltage. This filter means includes choke means for blocking the amplified RF signal from the supply of DC voltage, and RF shunt means for bypassing both in-band and out-of-band RF energy.

According to another aspect of the invention, a high power grounded-drain source follower RF amplifier circuit can comprise an input terminal; a supply of DC voltage; an output circuit; and a high power, high voltage large-chip transistor, i.e., the transistor die element of a KPT. In this case the transistor device or KPT includes a thermally and electrically conductive flange having an upper surface, and a semiconductor transistor die having a lower surface. A drain of the die is formed over a major portion of said lower surface, the drain being in direct electrical and thermal contact with the flange. A source and a gate are formed on the die away from the flat lower surface. The amplifier output circuit is coupled to the source. A DC-isolated input stage is RF coupled between the input terminal and the gate, i.e., between the gate and source, and floats with respect to the flange and the drain. The input stage includes an isolation transformer having a primary winding connected to the input terminal, and an isolated secondary winding having first and second ends coupled respectively to the gate and the source. Preferably, the output circuit includes a DC blocking output stage for passing RF signals in a predetermined RF frequency band. Also there is preferably an RF blocking DC feed stage coupling the transistor source to the supply of DC source voltage ($-V_s$). The feed stage can include RF shunt means for bypassing both in-band and out-of-band RF signals that appear at said source. Also, the input stage preferably includes a low value resistor (1–2 ohms) between the first end of the secondary winding and the gate to limit the gain of the transistor. There can be an optional bypass capacitor in parallel with this resistor to adjust the in-band gain. The semiconductor die has an input impedance, e.g., 5.56 ohms, between source and gate, and the series resistor has an ohmic value much less, e.g., 10 to 20% of the input impedance. A drain-gate feedback circuit is coupled to the first end of the transformer secondary winding and grounded to the drain. The drain-gate feedback circuit preferably includes a resistor and a capacitor connected in series. A gate-source return resistor is situated between source and gate, and has an ohmic value very large in comparison with the input impedance (35–40 KΩ). The input stage can also include a gatesource termination circuit formed of a capacitor and resistor in series between gate and source.

The transistor device, namely, the kilowatt power transistor or KPT, is a high voltage MOSFET hybrid device. The device that is preferably employed in the RF amplifier of this invention is described in detail in co-pending U.S. patent application. Ser. No. 08/957,100, filed Oct. 24, 1997, and having a common assignee. The disclosure in that patent application is incorporated herein by reference.

A 10 KW RF power generator can be constructed that employs four push-pull pairs of these KPTs, that is, a total of eight KPTs in the power amplifier stage. Each KPT has four high voltage MOSFET dies, with their drains directly connected to the copper plate below that acts as a thermal spreader. Between each die and the copper plate is a molybdenum tab that protects the die during power cycling, i.e., from differential in thermal expansion coefficient between the copper and the silicon, when the generator goes through RF power on-off cycles. All eight KPTs are mounted on a water-cooled copper heatsink, commonly referred to as a cold plate. Each push-pull pair of two KPTs delivers about 3 KW of RF output power, when the devices are operated in an overdriven class "C" mode in a grounded drain/source follower configuration. This configuration allows improved thermal design by eliminating the traditional insulator interface (typically BeO) between the drain region and the copper spreader plate. This means also that all four drains, i.e. the drains of the respective dies, are also directly connected to ground.

The four sources for each half (each KPT) of the push-pull pair are direct paralleled. All four gates for each half of the push-pull pair are impedance matched (step up), and paralleled via isolation transformers. This allows for much improved junction temperature tracking between the four dies on a given KPT over the entire output power dynamic range and into the various load VSWRs that can be encountered in plasma processes. The use of an unbypassed or partially bypassed high power series gate resistor is recommended for each MOSFET die to achieve unconditional stability over the entire dynamic range, in all load VSWR conditions.

A dissipative harmonics termination is provided via a high pass filter network at the input of the low pass filter after the combined output. This lowers gate-to-source differential voltage, and keeps the gate-source voltage within the specified limits (+30 V) for each MOSFET die.

The above and many other objects, features, and advantages of this invention will be more fully appreciated from the ensuing detailed description of a preferred embodiment, which is to be considered in connection with the accompanying Drawing.

BRIEF DESCRIPTION OF THE DRAWING

FIG. 6, which is formed of FIGS. 6A and 6B, is a circuit diagram of a high power RF amplifier, arranged in push-pull, according to another embodiment of the present invention.

DETAILED DESCRIPTION OF THE PREFERRED EMBODIMENT

Figure 1:
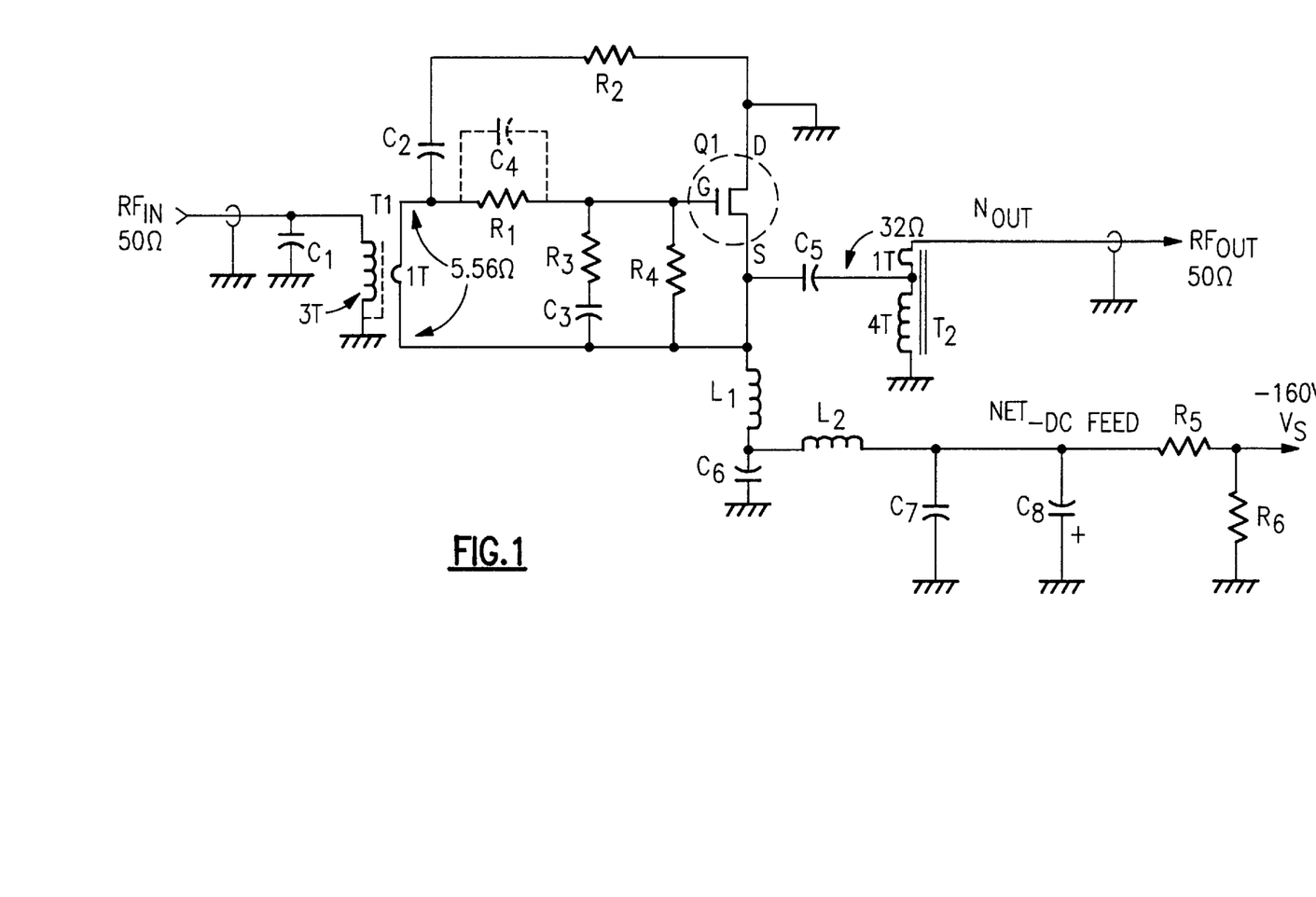
FIG. 1 is a schematic diagram of a single-ended circuit, in e.g., Class C operation, of an RF power amplifier in a grounded drain/source follower configuration, according to one embodiment of this invention.

With reference to the Drawing figures, and initially to FIG. 1, a single ended RF amplifier circuit is configured for Class "C" operation as a grounded drain/source follower transistor amplifier. This amplifier employs a single chip or single die MOSFET power transistor Q1. However, this transistor Q1 can also stand for each die of a multiple chip KPT, and is offered to explain the advantages and operations of the associated circuitry. Transistor Q1 has a drain terminal D tied to ground, by means of its contact with the flange, and has separate terminals for gate G and source S.

Here the amplifier is intended to provide RF power at a predetermined frequency, i.e., 13.56 MHz, at a power level, i.e., 350 watts, and at a given output impedance, for example 50 Ω. This circuit operates at -160 volts DC source voltage with about a 13 dB RF power gain. The load line is set at 32 Ω, drain-source, with a gate-source differential impedance of 5.56 Ω. A 13.56 MHz drive signal is applied at a single-ended input terminal $RF_{IN}$, here at a power of 22 watts and at an input impedance of 50 Ω. An input capacitance C1 compensates for the input inductive reactance. An isolating transformer T1 has a primary connected between the input terminal and ground, and a secondary with one end coupled to the gate G of transistor Q1 and the other end tied to the source S. The transformer T1 has a turn ratio of 3:1, and matches the input impedance of 50 Ω into the gate-source differential impedance of 5.56 Ω. A series gate resistor R1 is included between the one end of the transformer secondary and the gate G for improved operational stability over a wide range of VSWRs. This is a high power resistor, with an ohmic value of about 1 to 2 Ω. A drain-gate feedback circuit is formed of a resistor R2 and capacitor C2 connected in series between the drain D (i.e., ground) and the one end of the secondary winding of the transformer T1. This feedback circuit is optimized for input-output VSWRs, and provides for stable operation into high VSWRs. The capacitor C2 serves a DC blocking function, and the value of the resistor R2 depends on the gate-source impedance (here, for example, 5.56 Ω) and the drain-source impedance (here, for example, 32 Ω), power gain, and stability requirements into various load VSWRS.

A series combination of a resistor R3 and capacitor C3 provides a gate-source RF termination for stable operation into high VSWRS. Capacitor C3 serves as a DC blocking capacitor if DC biasing is used (which is discussed in a subsequent embodiment). The value of resistance R3 is optimized for expected VSWRs and RF gain. A resistor R4 provides a gate-source return, in the absence of transformer T1, for DC stability. This resistor can have a value that is very large with respect to the gate-source impedance (35–40 KΩ).

An optional bypass capacitor C4 can be placed in parallel with the resistor R1. The value of the capacitor is selected to bypass the desired frequency (e.g., 13.56 MHz), so that gain is reduced only for out-of-band energy. However, for many plasma applications, the capacitor C4 is preferably omitted, if there is sufficient gain available at the desired frequency.

An RF output network $N_{OUT}$ has an inductor L1 and capacitor C5, with the junction thereof coupled to the source S. The inductor and capacitor combination L1-C6 form a resonator to tune out the output capacitance of the transistor Q1. The capacitor C5 passes the 13.56 MHz output wave to the output terminal $RF_{OUT}$. An output transformer T2 is interposed between the capacitor C5 and the output terminal to match the drain-source impedance (32 Ω) to the output impedance (50 Ω). Here the transformer T2 has a turn ratio of 4:5.

Figure 2:
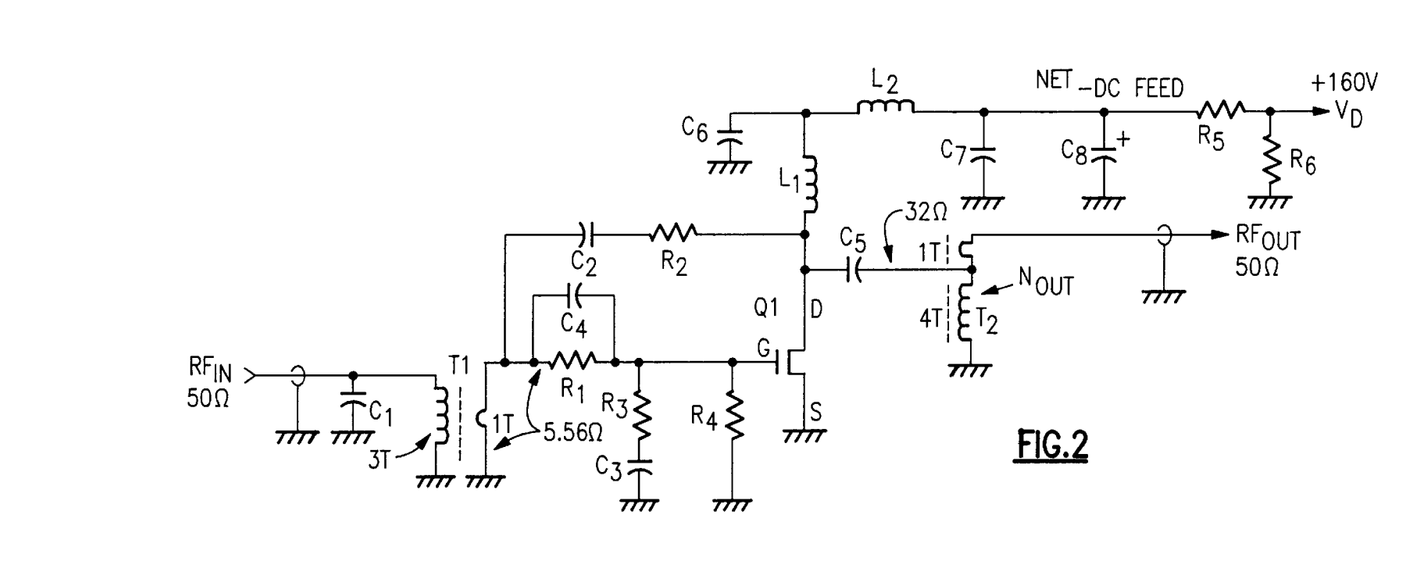
FIG. 2 is a schematic diagram of a similar circuit in grounded source/source follower configuration, for purposes of comparison with the FIG. 1 embodiment.

FIG. 2 shows a circuit that is similar to that of FIG. 1, except employing a conventional non-grounded drain. This circuit is offered for comparison purposes. Similar elements to those in FIG. 1 are identified with the same reference characters. The circuit represented in FIG. 2 is a single-ended circuit for a Class "C" grounded source amplifier. Grounded source MOSFET circuits are typical and are frequently used in RF plasma generation. This circuit is configured for stable operation into various load VSWRs over the entire dynamic range. Here, the transistor Q1 is a normally low level MOSFET with a BeO insulator disposed between the die and the conductive flange, i.e., between the drain and heatsink. However, for the sake of comparison with the circuit of this invention, the transistor Q1 can be considered a high voltage MOSFET with a BeO insulator between drain and heatsink. This circuit operates at an applied DC drain supply voltage ($+V_D$), in this example, +160 V and delivers, in this example, 350 watts RF output at 13.56 MHz with a 15 dB power gain and about a 70% drain efficiency. Input and output impedances of the circuit are both set at 50 ohms. There is a load line of 32 Ω (drain-to-source). The impedance between gate and source is 5.56 Ω. As in the embodiment of FIG. 1, the resistor R4 provides gate-source return in the absence of transformer T1, and helps establish DC stability. The resistor-capacitor combination R3-C3 provides a gate-source RF termination for stable operation into high VSWRs. Capacitor C3 is a DC blocking capacitor, when DC biasing is used. The value of R3 is optimized for stable operation into high VSWRs and desired RF gain.

The resistor-capacitor combination R1-C4 provides a series gate input resistance to adjust the in-band gain and to reduce the out-of-band lower frequency gain, to achieve stable operation into various loads over different power levels. The value of capacitor C4 is normally selected to bypass the desired frequency, which is 13.56 MHz in this example, for the required RF gain.

The resistor-capacitor combination R2-C2 provides drain-gate feedback with capacitor C2 serving as a DC blocking capacitor. The value of the feedback resistor R2 depends upon the gate-source impedance (e.g., 5.56 Ω), drain-source impedance (e.g., load line=32 Ω), and power gain. Additionally, the value of the resistor R2 is optimized for input-output VSWRs and stable operation into high VSWRs.

The DC feed net is connected between the DC voltage supply and the drain terminal D. In the DC feed net, inductor-capacitor combination L1-C6 forms a resonator to tune out the output capacitance of the MOSFET Q1. Inductor L1 can have an inductance of about 0.5 μH. The capacitor C6, which can be between 0.1 to 0.47 μf, returns RF energy to ground and forms a circulating current loop via the drain-source output capacitance. The inductor L1 is optimized for drain efficiency at the desired output (350 watts) for operation at a given drain source voltage $V_D$ (here, for example +160 V.). In the DC feed net, inductor L2 is an RF choke, capacitor C7 is an RF bypass capacitor (e.g., 0.22 µf ceramic) and C8 is a low frequency bypass capacitor (e.g., 22 µf electrolytic). A sense resistor R5 is used for measurement of the input DC current, and has a low fixed ohmic value (e.g., 0.01 Ω). The resistor R6 is a bleed resistor to bleed off any accumulated charge at the drain terminal, both for MOSFET protection and for personnel safety.

Here, the RF output network is connected with the drain terminal of the transistor Q1. In the output network, the capacitor C5 is a DC blocking capacitor. Transformer T2 is the output RF transformer, and has a turn ratio to match a 32 Ω drain-source impedance to the 50 Ω output impedance.

Because the transistor drain is isolated from the heatsink and flange, the power per transistor is somewhat curtailed as compared with the FIG. 1 amplifier. In addition, in a multiple parallel amplifier arrangement the dies for the respective amplifier MOSFETs will have different thermal loads, because of the presence of the BeO insulator. As mentioned before, the FIG. 2 diagram is offered only to show a comparable grounded-source circuit, but in reality, there are no large area, high voltage MOSFETs that are suitable to use in this circuit for the desired output power level and temperature cycling associated with plasma applications.

Figure 3:
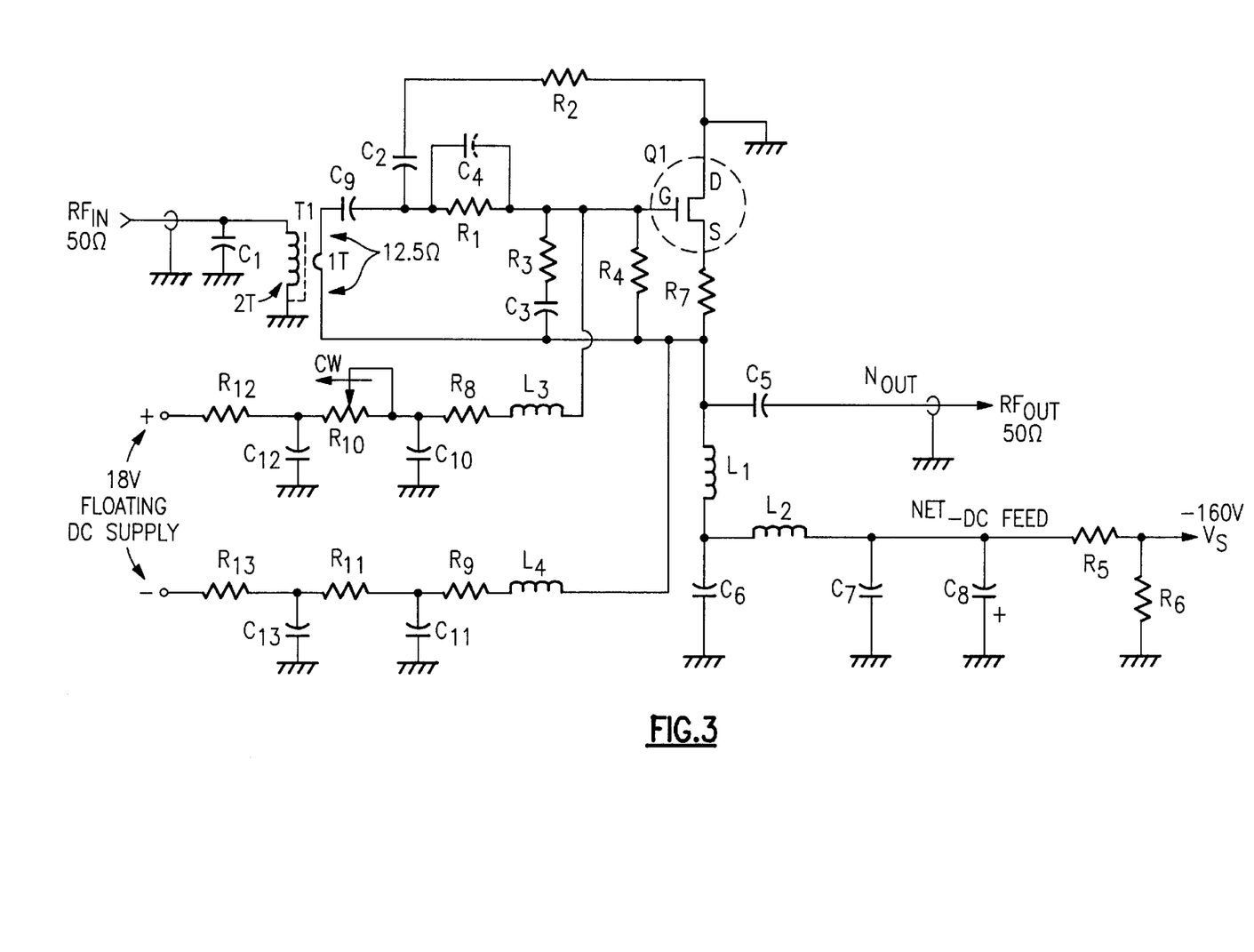
FIG. 3 is a schematic diagram of another embodiment, here shown with floating DC gate bias for Class A or AB operation.

FIG. 3 represents a single-ended circuit for grounded-drain/source follower operation. This circuit is similar in most aspects to that described above in reference to FIG. 1, and like elements are identified with similar reference characters. This circuit can be configured for Class "A" operation or for Class "AB" operation, and can serve as the basis for Class A and Class AB push-pull driver stages for a 1.25KW, 2.5 KW, 5 KW and 10 KW RF generator systems. Here, the transistor Q1 is a high voltage MOSFET, as in FIG. 1, with electrical characteristics similar to those described for the corresponding MOSFET transistor in FIG. 1. The exact transistor selection depends on the RF power output and gain requirements. The principal differences from the FIG. 1 embodiment have to do with the use of additional elements for applying a DC bias. Here, there is a small value resistor R7 (0.5–1 Ω) in series with the source terminal for both DC and RF stability. The output is taken after the source resistor R7. The biasing of the MOSFET transistor Q1 can be achieved in any of several ways, one of which is shown here. The approach illustrated in this embodiment is with the use of an 18 volt floating DC power supply (not shown here). The power supply is connected between the gate input and the source return with the required circuit elements for this application. It should be observed here that the required circuitry for biasing a grounded drain RF MOSFET is not trivial or in any way obvious, given the rather simpler biasing configurations used for grounded source MOSFET circuits. As illustrated, the biasing network is somewhat component extensive because of the large RF voltage swings present on both the source return and the gate input.

Here, the input impedance and output impedance for the amplifier are both set at 50 Ω. The load line is also set at 50 Ω, source-to-ground. The differential impedance between gate and source is 12.5 Ω. It should be noted that both source return and gate terminals are at −160 volts DC potential via the secondary winding of the transformer T1 and the resistor R4. The complexity of the biasing circuit arises out of the need for impedances to accommodate the differential voltages between the source and gate electrodes, where there is a constantly fluctuating source voltage level.

As in the previous embodiment, resistor R4 is provided as a gate-source DC return or pull-up for DC stability and protection. This resistor R4 protects the MOSFET Q1 from excessive gate-source differential DC voltage, if the DC path via the secondary winding in the transformer T1 is broken.

The resistor-capacitor combination R3-C3 provides gate-source termination for stable operation under high VSWRs over the entire dynamic range of operation. Capacitor C3 is a DC blocking capacitor, and the resistor R3 is optimized for stability and RF gain. The resistor R1 is the series gate input resistor, with a value of about 2 Ω, and is required for operational stability into high VSWRs over the entire dynamic range. In this embodiment resistor R1 is bypassed by a capacitor C4, and the value of this capacitor C4 is optimized for RF gain and stability for a given value of the source resistor R7, which can be about 0.5–1 Ω.

The resistor-capacitor combination R2-C2 provides drain-gate feedback with capacitor C2 employed for DC blocking. The ohmic value of resistor R2 is initially selected for typical input and output impedances and RF power gain. Resistor R2 is also optimized for stability into high VSWRs over the entire dynamic range. In the source power supply network, the inductor-capacitor combination L1-C6 acts as a resonator to tune out the source-drain output capacitance of the MOSFET Q1. Capacitor C6 serves for DC blocking and also provides an RF ground return path to shunt RF signals.

Also shown here is a DC blocking capacitor C9, e.g., about 1 µf at 200 v. A stabilizing resistor R7 is placed in series between the source S and the return to the second end of the secondary of transformer T1. This resistor is preferably a 0.5 to 1 Ω, 25 watt resistor, flange mounted.

The output signal is taken from the source S after the series source resistor R7, via a DC blocking capacitor C5. As with the previous embodiment, there is a load line of 50 Ω. On the input side, the transformer T1 in combination with the compensation capacitor C1 matches the gate-source differential impedance to 50 Ω. The transformer T1 has a turns ratio of 1:2 to match 12.5 Ω gate-source differential impedance to 50 Ω at the input $RF_{IN}$.

In this embodiment, there are RF filtering networks required, namely coil L3, resistor R8 and capacitor C10 on one leg tied to the gate G, and coil L4, resistor R9, and capacitor C11 tied to the source S, to avoid drain-gate feedback via the gate biasing networks, which are effectively in parallel with the desired R2-C2 gate-drain feedback path. A variable resistor RIO provides for bias adjustment in series with the gate input string, and a complementary resistor R11 is situated symmetrically in the source return string. Capacitors C12 and C13 are RF bypass capacitors to assure that no RF signals go back to the floating power supply or enter the gate-source terminals as stray signals from some external source. Resistors R12 and R13 are selected for the required gate-source threshold window, which varies from about 2 to 4 volts for most high voltage MOSFET transistors.

The inductor L2, capacitors C7, C8, and resistors R5, R6 function as in the previously described embodiment.

Figure 4:
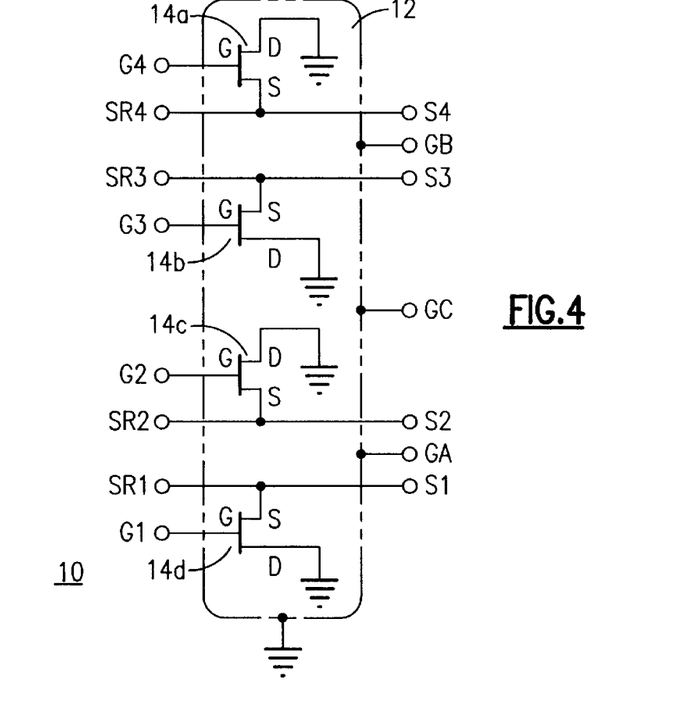
FIGS. 4 and 5 are schematic and plan views of a four-chip kilowatt power transistor as employed in connection with this invention.
Figure 5:
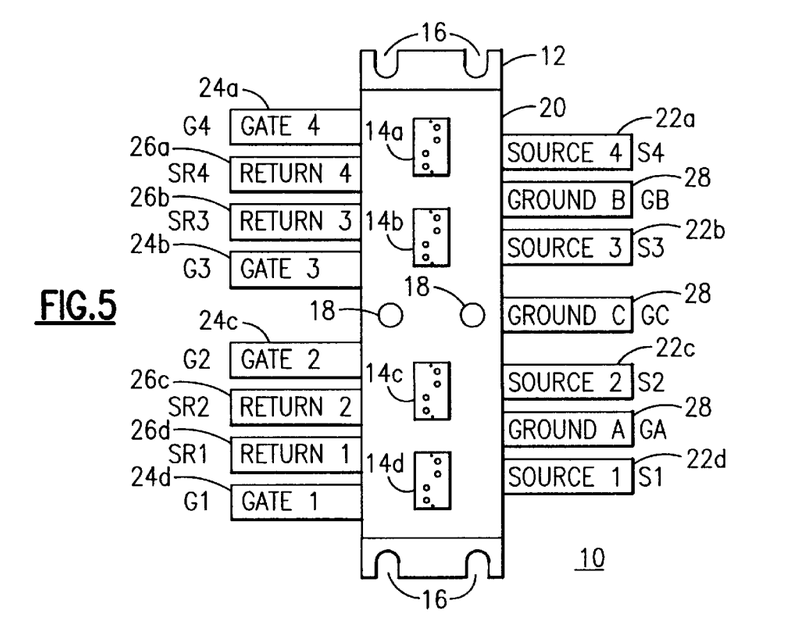

With reference to FIGS. 4 and 5, a kilowatt power transistor 10 has a flat metal flange 12 or base, which mounts on a suitable heat sink (not shown) that can be formed as part of the chassis of an amplifier. The transistor here is a quad or four-chip array design, with four transistor chips or dies 14a, 14b, 14c, 14d mounted on the flange 12, and with their respective drain regions D grounded to the flange 12. Each transistor die has a respective gate G1 to G4 and a respective source S1 to S4. The sources are connected also to source return leads SR1 to SR4, as shown. The flange 12 is provided with either end slots or holes 16 and mounting through holes 18 for attaching to the associated heat sink. A plastic, ceramic, or metal case covers the four dies 14a to 14d, and leaves the two ends of the flange 12 exposed. The flange 12 itself serves as the grounded drain lead or electrode for each of the four transistor elements, supplemented by additional ribbon leads 28 intended to connect to the external RF circuit grounds. The ribbon source leads 22a to 22d, gate leads 24a to 24d, and source-return leads 26a to 26d (these are tied to the respective source leads) complete the RF electrode terminals. These leads 22, 24, 26, 28 are crimped near their exit from the sides of the case to provide strain relief for the respective leads. This device, and several variants thereof, are described in greater detail in copending patent application. Ser. No. 08/957,100, filed Oct. 24, 1997, now abandoned.

Figures 6, 6A:
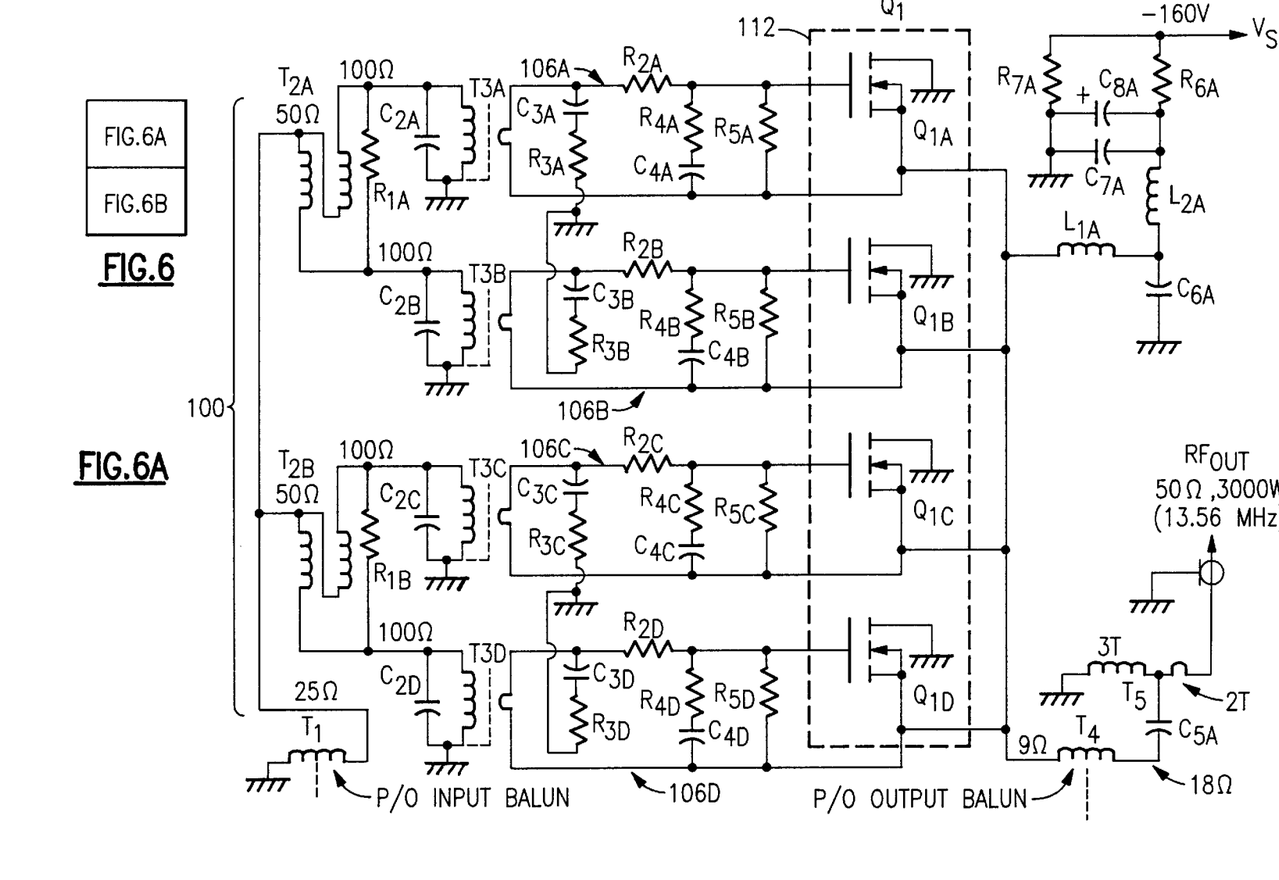
Figure 6B:
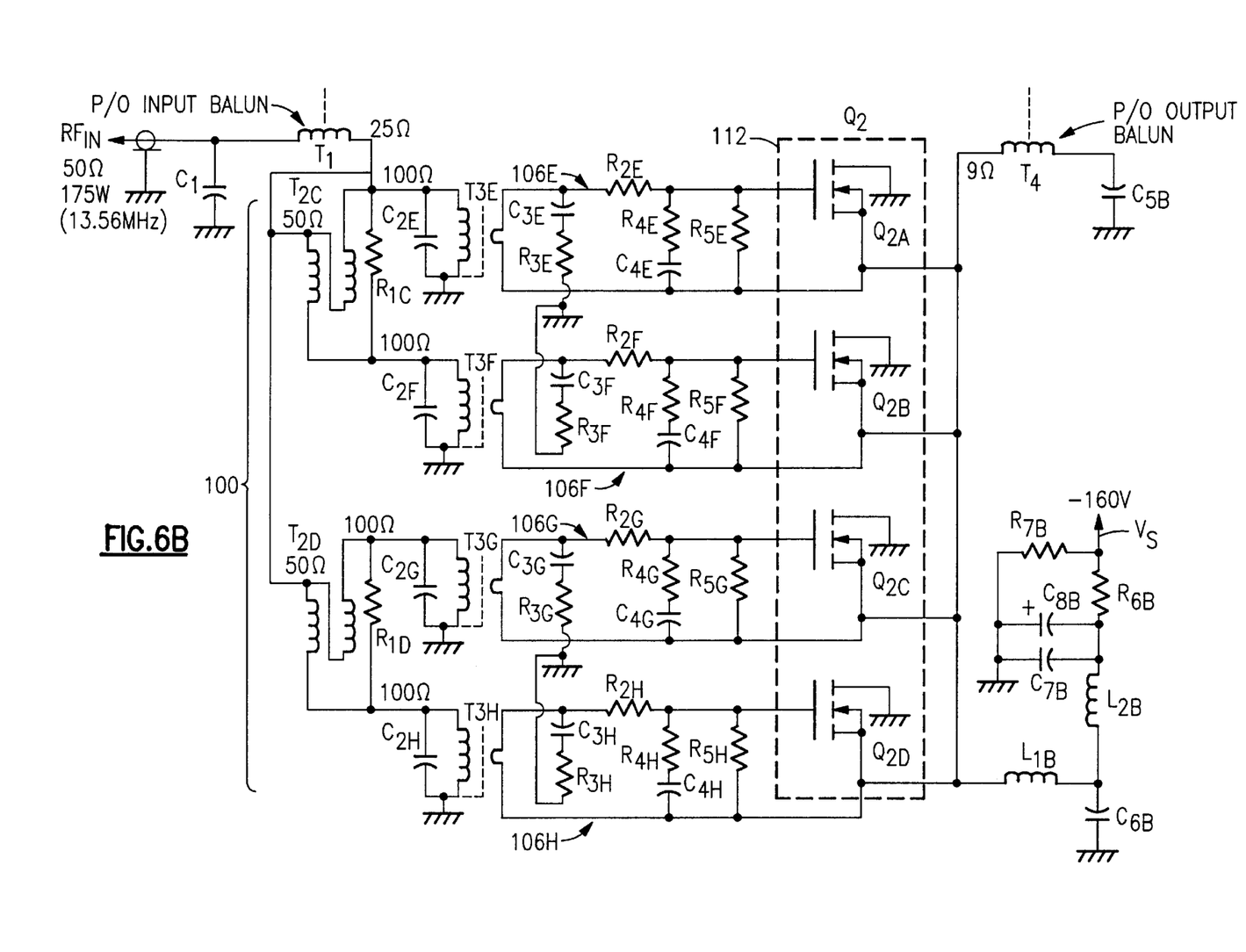

Now with reference to FIG. 6 (formed by placing FIGS. 6A and 6B together), a power amplifier 100 employs a push-pull pair of KPTs Q1, Q2, biased in Class C mode of operation. The upper half (transistor Q1) is shown in FIG. 6A and the lower half (transistor Q2) is shown in FIG. 6B. Here, the push-pull pair Q1, Q2 is provided with split and isolated gate inputs for each MOSFET die for improved die temperature tracking. The complete push-pull pair is designed to deliver 3000 watts at 72% efficiency and 11 dB RF power gain.

Each KPT Q1, Q2 forms one-half of the push-pull pair and has four high voltage MOSFET dies Q1A, Q1B, Q1C, Q1D, and Q2A, Q2B, Q2C, Q2D, respectively, whose drains are directly connected to ground via the associated copper flange 112. The source terminals of the dies for each respective KPT are direct paralleled, i.e., connected in parallel to form a 9 Ω impedance interface for each push-pull half. As for the gate terminals, each die Q1A to Q2D has a separate source-gate circuit, so as to achieve DC stability, RF stability, and impedance matching independently. The gates are then paralleled via a pair of splitter/isolation transformers. There is a gate-source input circuit provided for each die similar to that shown and described above in respect to FIG. 1. Here, the resistor, capacitor, and inductor elements are given a common reference character, with either a number suffix to correspond to the associated KPT (Q1 or Q2) or letter (A through H) to correspond to the associated die.

The gate terminals for the MOSFET dies Q1A to Q2D each have a respective gate-source input circuit 106A to 106H. Each has a gate-source resistor R5A to R5H for DC stability. Good RF stability into a 50 Ω load over the entire dynamic range is achieved via respective drain-gate feedback series resistor-capacitor combinations R3A, C3A to R3H, C3H. RF stability into high load VSWRs over the entire dynamic range is achieved via gate-source series resistor capacitor combinations, R4A, C4A to R4H, C4H. RF stability into high load VSWRS, including open/short condition, and at all phases, is achieved using unbypassed series gate resistors R2A, R2B, . . . R2H.

Impedance transformation from differential to common mode is achieved via transformers T3A, T3B, . . . T3H. The secondary of each of these gate transformers is shielded to protect against any core heating, which may result from flux due to RF voltage difference between the secondary winding and ground. The turn ratio for these transformers T3A to T3H is 3:1, and this creates a 100 Ω input impedance at the input of the primary winding of the transformers. Capacitors C2A, C2B, . . . C2H disposed across the primary windings compensate for the inductive reactance due to long gate and source traces on the associated printed circuit boards.

The input drive signal is applied at an input terminal $RF_{IN}$ to a balun transformer T1, which splits the drive signal into forward and reverse phases. The transformer T1 has one winding feeding the upper half (i.e., KPT Q1) and the other winding feeding the lower half (i.e., KPT Q2). The input drive signal is supplied at 13.56 MHz, at 175 watts and the input impedance is 50Ω. The two balun windings, being mutually coupled, each have an output impedance of 25Ω. For each push-pull half, there are two splitter/isolation transformers, i.e., transformers T2A, T2B for the upper half and transformers T2C, T2D for the lower half. The input impedance for each splitter/isolation transformer is 50 Ω, which are joined together to result in a 25 Ω interface with the balun output, which is also 25 Ω. The transformers T2A to T2D split the RF input drive signal to provide 100 Ω impedance outputs to match the primary winding impedance of the corresponding transformers T3A to T3H. This circuit configuration sends balanced drive current to the dies Q1A to Q1D and Q2A to Q2D, even where the dies are not perfectly matched. Isolation resistors R1A, R1B, R1C, and R1D are connected across each splitter/isolation transformer T2A, T2B, T2C, T2D to achieve matched terminal impedances.

Each KPT has an output impedance, at the paralleled sources, of 9 Ω, and these are combined in an output balun transformer T4, for a combined interface impedance of 18 Ω. An output transformer T5 matches the 18 Ω impedance to the load impedance of 50 Ω. For this reason, the transformer T5 has a turns ratio of 3:5. RF output capacitors C5A and C5B are selected to pass the frequency of interest, i.e., a band around 13.56 MHz in this example.

Each push-pull half has a DC feed network connecting the paralleled sources of the KPTs to the supply of source voltage ($-V_S$). In the respective DC feed networks, resonator inductors L1A, L1B are optimized for maximum efficiency at the desired frequency (e.g., 13.56 MHz) by tuning out the combined drain-source output capacitances. Capacitors C6A, C6B provide an RF return path to ground and also block the DC supply. The RF chokes L2A, L2B, capacitors C7A, C7B; capacitors C8A, C8B; resistors R6A, R6B; and resistors R7A, R7B perform the functions of the similar components, L2, C7, C8, R6 and R7 as described in connection with FIG. 1.

The push-pull pair described hereinabove results in stable operation over the entire dynamic range into all VSWRs. This push-pull pair configuration achieves improved efficiency and excellent die temperature tracking among the four dies of each KPT, even if the MOSFET dies are not evenly matched, and even if the printed circuit board layout associated with the different dies is not exactly identical or symmetrical, which may occur because of space constraints. With the split and isolated gating as shown and described here, there has been a remarkable improvement in temperature tracking over a direct parallel gating configuration of amplifier. That is, the temperature differential ΔT from die-to-die has been improved from ΔT=80° to ΔT=10° C., when the gating drive signal is split, with isolation. The concept presented here achieves the benefits of conventional corporate combining with the benefits of reduced numbers of output transformer assemblies. Also, the DC and RF stabilization circuits for each MOSFET allow stable operation over the entire dynamic range into various load VSWRs, i.e., 1.0:1, 1.5:1, 2:1, 3:1, . . . to open/short in all phase conditions.

Figures 7, 7A:
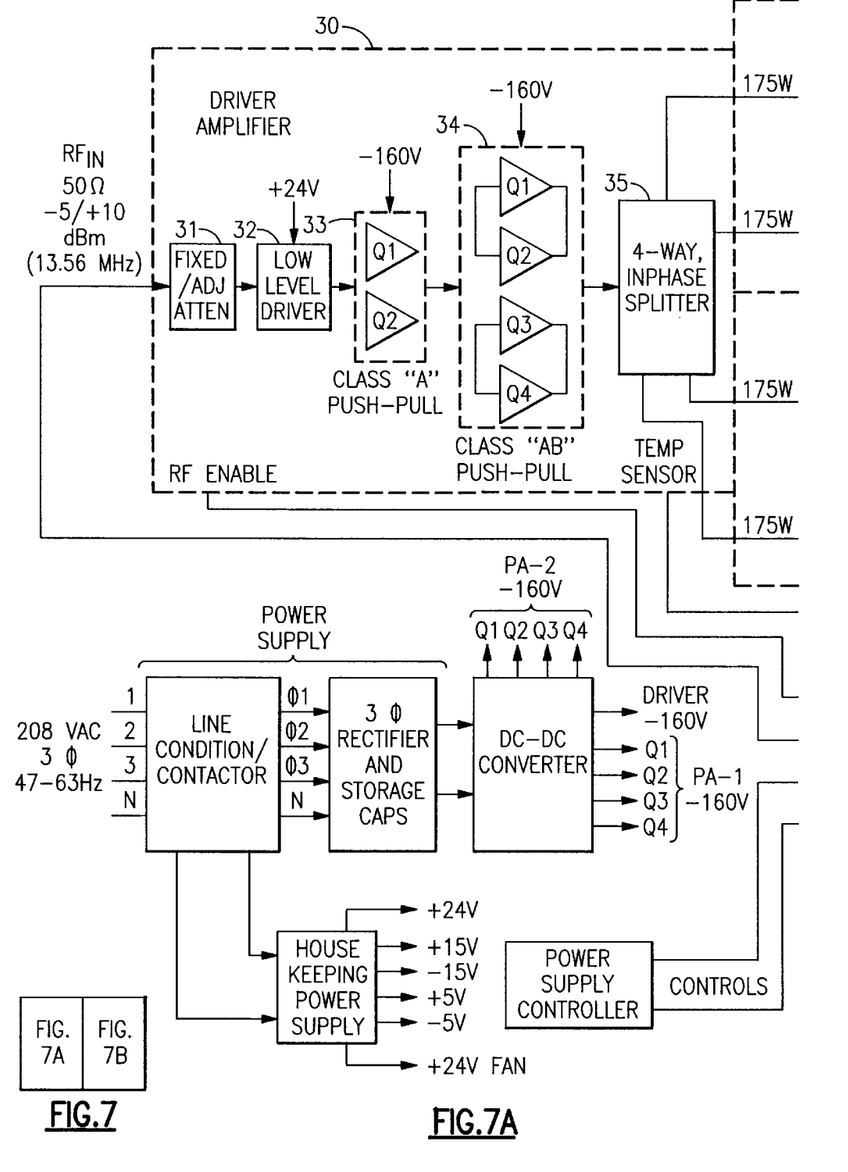
FIG. 7 is an overall circuit diagram of a 10 KW RF generator system employing the principles of this invention.
Figure 7B:
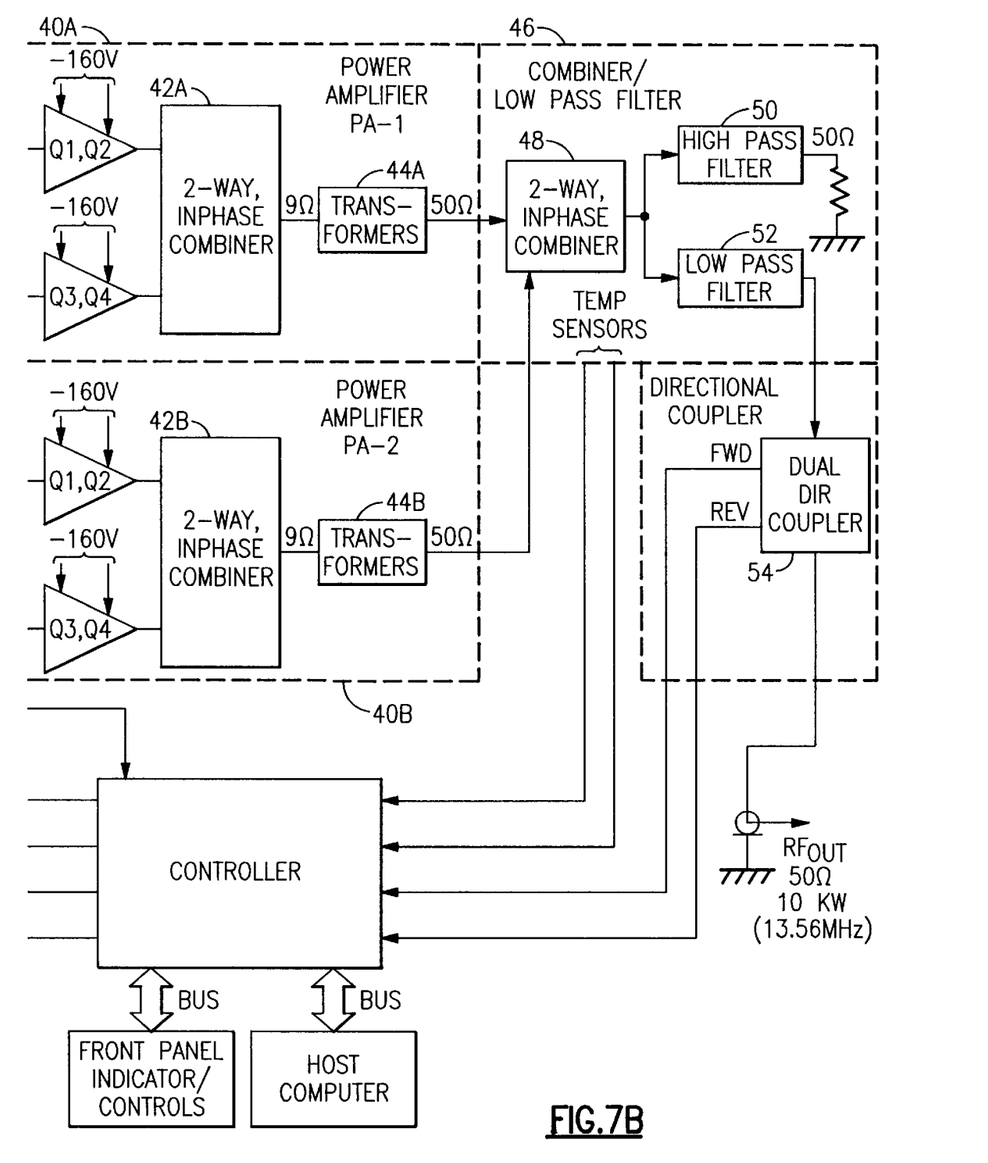

To increase the power output from 3 KW to 10 KW, a number of pairs of KPTs can be arranged in push-pull, e.g., as shown in FIG. 7, formed of FIGS. 7A and 7B. A driver amplifier board 30 has an attenuator 31 coupled to the RF input $RF_{IN}$, followed by a low-level driver amplifier 32, a Class "A" push-pull pair 33, and then a Class "AB" push-pull amplifier stage 34. The latter produces a 700 watt drive signal, which is divided in a splitter stage 35 into four 175 watt drive signals, two each to be applied to respective power amplifier boards 40A and 40B. Each power amplifier board 40A, 40B has two sets of 3 KW push-pull pairs (Q1, Q2 and Q3, Q4) of kilowatt power transistors, each with an interface impedance of 18 Ω. Here, the outputs of the two pairs, Q1, Q2 and Q3, Q4, are combined via 2-way in-phase combiners 42A, 42B, respectively to output 6 KW at 9 Ω output impedance. The outputs on each board are matched to 50 Ω, within a VSWR of 1.1:1, via transformers 44A, 44B, which here represent dual transformers in cascade. Here, a first transformer has a turn ratio of 2:3 and a second transformer also has a turn ratio of 2:3. The two 50 Ω outputs are combined in a combiner/low pass filter board 46 in a 2-way in-phase combiner 48. This 2-way in-phase combiner has a combined terminal impedance of 25 Ω within a 1.1:1 VSWR. This combiner includes a transformer, with a turn ratio of 3:4 which transforms the impedance to 50 Ω.

In order to maintain a −55 dBc, or below, harmonic content over the entire dynamic range, a filter network 50 and 52 through which the combined output passes, includes a seventh order 0.01 dB passband ripple Chebyshev response low pass filter 52. This has a cutoff frequency of 16.27 MHz, with a 3 dB point at 18.64 MHz. Second harmonic rejection from this filter is typically 42 dB. The third harmonic rejection is typically 65 dB. However, for RF generator in plasma applications, the rejection of harmonics by the low pass filter 52 is not enough, and steps must be taken to dissipate the harmonics energy. Dissipative termination of harmonics is achieved through the high pass filter 50, which is added at the input of the low pass filter. This low pass/high pass combination forms a diplexer. In this arrangement, the harmonics are absorbed in the high pass filter's resistive termination without appreciably affecting the main 13.56 MHz signal. In the power amplifier circuit of this invention, the terminated high pass filter protects the MOSFET dies from excessive gate-source voltage differential. Otherwise, ground currents associated with these harmonics would develop excessive instantaneous gate-source voltage differentials, thereby damaging the MOSFET. That is, if the harmonics are not properly dissipated, the gate source voltage can exceed a ±30 volts maximum gate-source voltage delta specification.

The high pass filter 50 in this invention has a fifth order, 0.1 dB passband ripple Chebyshev response. The cutoff frequency of the high pass filter is 25.76 MHz with a 3 dB point at 21.71 MHz.

Figure 8:
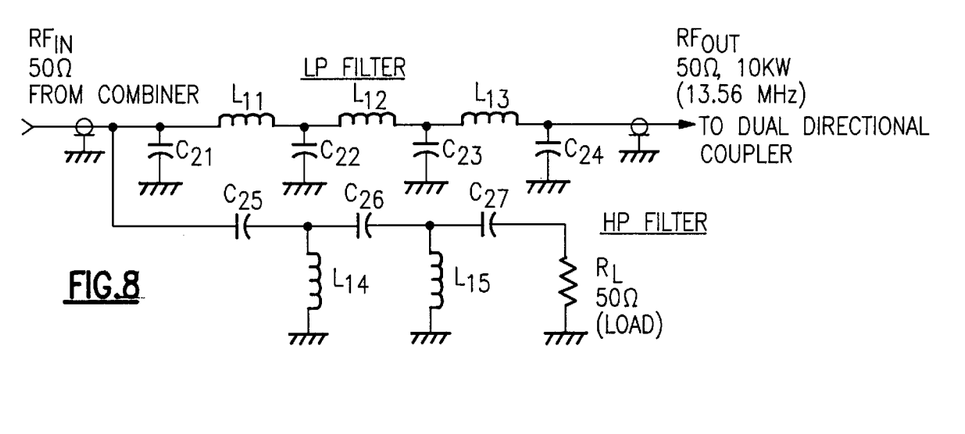
FIG. 8 is a circuit diagram of a low pass/high pass filter arrangement for dissipating out-of-band harmonic energy, as employed in connection with the present invention.

The high pass filter 50 and low pass filter 52 are shown in more detail in FIG. 8, in which the low pass filter 52 is made up of capacitors C21, C22, C23, and C24 and inductors L11, L12, and L13, supplying the amplified clean RF wave at 13.56 MHz. The high pass filter 50 is made up of series capacitors C25, C26, and C27, and shunt inductances L14 and L15. The bypassed higher frequency components which include 2nd, 3d, 4th, 5th, etc. harmonics, are consigned to a 50 Ω dissipating resistance RL. This high pass/low pass filter arrangement is a diplexer, and minimizes harmonic distortion and creates a dissipative harmonic termination.

The dissipative harmonic termination via the high pass filter protects the high voltage MOSFET dies from excessive gate-source voltage differential (±30 volts is the maximum specified limit).

The directional coupler 54 is designed to handle 10 KW of RF power with a 46 dB forward coupling and greater than 40 dB directivity. The coupler 54 has both forward and reverse ports, each with built-in band pass filter networks, with ±10% bandwidth, ±0.02 dB ripple and greater than 25 dB rejection of harmonics. The directional coupler 54 can be of a transformer based design using high Q and moderate mu (40 perm) ferrite material, or it can be a fractional transmission line design.

The intermediate driver stage 33 puts out 30 watts at a 1 dB compression with a 17 dB power gain, and is comprised of a pair of high voltage MOSFETs in push-pull. Each MOSFET is biased in a Class "A" mode at 0.5 ampere. Biasing is achieved by means of a floating 18 volts DC supply as shown in FIG. 3. The output driver stage is comprised of a pair of dual high voltage MOSFETs in push-pull. Each MOSFET is biased in Class "AB" at 0.25 ampere. The push-pull pair outputs 700 watts at 2 dB compression, with a 13 dB power gain. The output is then split four ways via the in-phase splitter 35.

The output of the low pass filter is then fed through a dual directional coupler 54 to the RF output terminal $RF_{OUT}$.

There are other ancillary and peripheral elements, such as power supplies, controls and sensors, which are included in this RF generator system, but are outside the scope of this invention. However, these additional elements are included in FIG. 7 for the purpose of completeness.

The high voltage, high power MOSFET KPTs as employed in preferred embodiments of this invention, may have the following characteristics: Drain-source breakdown voltage $V_{DSS}$=1000 volts, maximum; continuous drain current $I_D$=11 amperes, maximum; gate-source voltage $V_{GS}$= ±30 volts; gate threshold voltage $V_{G-TH}$=2 to 4 volts; forward transconductance $G_{FS}$=7 to 11 Siemens; drain-source on-state resistance $R_{DS-ON}$=1 ohm maximum; junction-case thermal resistance $R_{\theta JC}$=0.4 degrees C/watt maximum; input capacitance $C_{ISS}$=2460 pf (typical); output capacitance $C_{OSS}$=360 pf (typical); reverse transfer capacitance $C_{RSS}$= 105 pf (typical); total gate charge $Q_q$=90 nC (typical); gate-source charge Qgs=10 nC (typical); and gate-drain charge $Q_{gd}$=50 nC (typical).

The gate-source threshold voltage balance between the four dies of the KPT should be within about 0.2 volts for die-to-die uniformity. This results in all four dies turning on at the same time. The drain-source on-resistance balance as among the four dies of the KPT should be within about 8% for drain efficiency tracking. Forward transconductance balance among the four dies of the KPT should be within 1 Siemans. For efficient performance at favorable RF power gain, the DC characteristics of the four dies of each KPT should be matched, at the die level. The RF performance should be checked and measured at the KPT level. The RF gain balance among the four dies of a given KPT should be within 0.5 dB. The drain efficiency balance between the four dies of a given KPT should be within 1%. The gate-source threshold should be matched to within 0.2 volts for simultaneous turn on of each MOSFET die on a given KPT. The gate-source on resistance should be within 8% for even loading of each MOSFET die. The forward transconductance should be within 1 Siemans, for even current draw for each die on a given KPT. The matching of these three DC parameters is best achieved using die mapping during the KPT fabrication process. The four dies for the KPT should be selected from the same wafer, and from adjacent locations on the wafer. The DC characteristics such as gate-source threshold voltage and drain-source on-resistance, along with the RF gain and drain efficiency, should be measured for each die at the KPT level.

For the push-pull pair for a given generator application as described above, the pairs of KPTs should be matched. In other words, the four dies from one KPT should be selected from neighboring chip location to those from which the dies for the other KPT were selected, to optimize performance with respect to RF gain, efficiency, current tracking between the KPTS, temperature tracking between the KPT. The delta RF gain between the four dies of the KPT should be withing 0.5 dB; the delta RF efficiency between the four dies of the KPT should be within 1%. The KPT with the higher average gate-threshold should be used for the forward wave portion, which is directly coupled to the input balun or splitter, while the KPT with the lower average gate-threshold should be used for the reverse wave portion, which is inductively coupled. Here, the difference between the forward and reverse wave KPTs would be about 0.1 dB to 0.2 dB.

The input balun is preferably of a transmission line design, using twisted bifilar windings, and having a characteristic impedance of 50 Ω on a ferrite core of moderate permeability ($\mu$=40) and high Q (low loss). The input balun splits the input signal (at 50 Ω impedance) into forward and reverse phase waves at 25 Ω impedance each. The forward phase wave is split into four signals equal in amplitude and phase, with greater than 25 dB built-in isolation, via a pair of splitters that are direct paralleled at the input. Each of these splitters is based on a ferrite loaded (125 permeability, high Q, low loss) transmission line design, using twisted bifilar windings, with a characteristic impedance of 100 Ω. The input impedance of each splitter is 50 Ω, and the two outputs are at 100 Ω. The paralleled impedance of the two forward phase splitters at the input is 25 Ω, which matches the output impedance of the input balun for the forward phase portion.

The reverse phase portion has corresponding features and attributes.

Each of the forward phase wave and the reverse phase wave is split into four waves to drive each MOSFET die of the respective KPT. The input drive circuits for each die are identical, consisting of the following functionalities, namely, input transformer, series input gate resistance (which can be unbypassed or partially bypassed), DC termination or pull-up, and source-drain RF feedback. Each MOSFET die has a separate input transformer, with an input impedance of 100 Ω. The input wave at the primary of the transformer is with respect to ground, and the output wave at the secondary is with respect to source (or signal output level). The output impedance of this transformer with respect to source is about 11 Ω. This transformer is a ferrite loaded ($\mu$=125, high Q, low loss) transformer-coupled design, with an input to output turn ratio of 3:1. Each MOSFET die has its own series input gate resistance, with a value ranging from 1–2 ohms mounted on a 25 watt flange. This provides stability for the complete dynamic output power range into the entire range of VSWRs, i.e., open-short-all phases. This resistor is unbypassed or partially bypassed, depending upon the RF gain and RF stability requirements.

Each MOSFET die has its own input RF termination between gate and source. This termination is made up as a series resistor-capacitor combination, with the capacitor acting as a DC block. The resistor value is about 50 Ω, which is about 4.5 time the 11 Ω interface impedance. This resistor helps to stabilize operation into high VSWRs over the entire dynamic range. Its value is chosen as a compromise between RF power gain and RF stability. Each MOSFET die also has its own DC termination resistor disposed between gate and source. This resistor has a value between 30 and 40 KΩ, and provides DC stability and pull-up in case the DC connection via the input transformer secondary winding is broken. Further, each MOSFET die has its own source-drain RF feedback network, which can consist of a resistor-capacitor series combination with the capacitor serving as a DC block. In this case, the resistor can be a 150 W flange mount resistor with a value ranging from 400 to 560 Ω, depending upon the RF power gain and the stability requirements. This network provides RF input/output matching plus RF output stability into various loads. The actual value of the resistor is a compromise between the required RF power gain and RF output stability into all phase conditions, including open, short, and all phases of load.

The KPTs have the outputs of their four dies, i.e., the sources, connected in direct parallel via a printed circuit board. These connections are made as symmetrically as possible. The output of the forward phase KPT forms a forward phase wave value at 9 Ω interface impedance, and the output of the reverse phase KPT correspondingly forms a reverse phase wave, also at 9 Ω interface impedance.

The combined output capacitance (i.e., source-to-drain capacitance) for each KPT is dynamically compensated by a resonator circuit combination with a capacitor as a DC block, and allowing circulating RF current to shunt to ground. The value of the inductor ranges between 0.3–0.5 $\mu$H and is accomplished using high frequency, low loss, low permeability powdered iron core material. The inductor value is optimized for RF efficiency and provides an improvement in efficiency of 5–8%.

Both forward and reverse phase waves are combined via an output balun transformer, with input impedances of 9 Ω and output impedances of 18 Ω. This output balun transformer is also a transmission line type ferrite loaded device ($\mu$=40, high Q, low loss) using twin strips with 18 Ω characteristic impedance. Proper DC blocking functions are accomplished around this transformer by use of high voltage, high current porcelain capacitors. The 18 Ω output impedance of the balun is transformed to 50 Ω via a 3:5 turn ratio step-up transformer. The output transformer consists of a transformer-coupled autotransformer, using multifilar copper strips with a high Q, low loss, moderate permeability ($\mu$=40) ferrite core material.

The negative DC supply voltage is fed to each KPT via separate and identical DC feed circuitry. Each feed net consists of inductor-capacitor combination such that no RF energy from the power amplifier enters the power supply, and no RF energy from the power supply or other sources enters the power amplifier. This is accomplished with a large series inductor, i.e., a choke, and a parallel pair of capacitors, one an RF bypass capacitor and the other a low frequency bypass capacitor. The DC supply feeds include proper bleeder and sense resistors, for protection and current monitoring.

While this invention has been described with reference to selected preferred embodiments, it should be understood that the invention is not limited to these embodiments. Rather, many modifications and variations will become apparent to those of skill in the art, without departure from the scope and spirit of the invention, as defined in the appended claims.

We claim:

1. A high power push-pull RF amplifier for amplifying RF power in a given frequency band, comprising an RF input terminal, an RF output terminal, a DC power source, first and second kilowatt power transistor devices, each said kilowatt power transistor device including a thermally and electrically conductive flange, a multi-chip array formed of a plurality of semiconductor dies, each said die having a flat lower surface with a drain formed over a majority of said lower surface, a source and a gate formed respectively on portions of the die away from said flat lower surface, and means for seating the drains of the dies in direct thermal and electrical contact with said flange so that said flange serves as drain terminal and as heat sink for said dies; first splitter means coupled to said RF input terminal for splitting an RF input drive signal into a forward phase portion and a reverse phase portion; second splitter means for splitting said forward phase portion of the drive signal into a plurality of isolated signals for supplying to the gates of said first kilowatt power transistor device; third splitter means for splitting said reverse phase portion into a plurality of isolated signals for supplying to the gates of said second kilowatt power transistor device; for each of said semiconductor die of said first kilowatt power transistor device a respective gate-source input circuit which is RF coupled to an associated output of said second splitter means and which is floating with respect to the flange of said first kilowatt power transistor device; for each said semiconductor die of said second kilowatt power transistor device a respective gate-source input circuit which is RF coupled to an associated output of said third splitter means but is floating with respect to the flange of said second kilowatt power transistor device; combiner means having inputs coupled to the sources of said first and second kilowatt power transistor devices for combining amplified RF outputs therefrom to supply an amplified RF signal to said RF output terminal; a supply of DC source voltage; and filter means connecting the sources of said kilowatt power transistor devices to said supply of DC voltage, said filter means including choke means for blocking said amplified RF signal from said supply of DC voltage, and means for bypassing RF energy as may be picked up from the DC power supply or other circuitry.

2. The high power RF amplifier of claim 1 wherein said choke means of said filter means comprises an RF choke coil in series between the supply of DC voltage and the sources of one of said kilowatt power transistor devices.

3. The high power RF amplifier of claim 2 wherein said means for bypassing includes an inductor between the RF choke coil and said sources, and an RF shunt capacitor between an RF ground and a junction of the inductor and the RF choke coil.

4. The high power RF amplifier of claim 1 wherein said filter means includes a series circuit formed of an inductor, an RF choke coil, and a resistor.

5. The high power RF amplifier of claim 4 wherein said resistor has a value of about 0.01 ohms.

6. The high power RF amplifier of claim 3 wherein said inductor has an inductance between 0.3 and 0.5 $\mu$H and said shunt capacitor has a value between about 0.1 and 1 $\mu$f.

7. A high power grounded-drain source follower RF amplifier circuit which comprises an input terminal; a supply of DC voltage; an output circuit; and a high power, high voltage large-chip transistor which includes a thermally and electrically conductive flange having an upper surface, and a semiconductor transistor die having a lower surface, with a drain of the die being formed over a major portion of said lower surface, said drain being in direct electrical and thermal contact with said flange, a source and a gate formed respectively on said die away from said flat lower surface, said output circuit being coupled to said source; and a DC-isolated input stage between said input terminal and said gate and which is floating with respect to said drain; wherein said input stage includes an isolation transformer having a primary winding connected to said input terminal and an isolated secondary winding having first and second ends coupled respectively to said gate and said source.

8. The RF amplifier circuit of claim 7 wherein said output circuit includes a DC blocking output stage for passing RF signals in a predetermined RF frequency band.

9. The RF amplifier circuit of claim 8 comprising an RF blocking DC feed stage coupling said source to said supply of DC voltage.

10. The RF amplifier circuit of claim 9 wherein said feed stage includes RF shunt means for bypassing RF signals that otherwise appear at said source.

11. The RF amplifier circuit of claim 7 wherein said input stage includes a low value resistor between the first end of said secondary winding and said gate to limit gain of said transistor for unconditional stability.

12. The RF amplifier circuit of claim 11 wherein said semiconductor die has an input impedance between said source and said gate, and said resistor has an ohmic value less than said input impedance for the desired gain.

13. The RF amplifier circuit of claim 7 comprising a drain-gate feedback circuit coupled to said first end of said secondary winding and grounded to said drain.

14. The RF amplifier circuit of claim 13 wherein said drain-gate feedback circuit includes a resistor and a capacitor connected in series.

15. The RF amplifier circuit of claim 7 wherein said semiconductor die has an input impedance between said source and said gate, and comprising a gate-source return resistor connected between said source and said gate, and having an ohmic value that is very large in comparison with the input impedance.

16. The RF amplifier circuit of claim 7 wherein said input stage includes a gate-source termination circuit formed of a capacitor and resistor in series between said gate and said source.

17. A high power push-pull RF amplifier for amplifying RF power in a given frequency band, comprising an RF input terminal, an RF output terminal, a power source, first and second kilowatt power transistor devices, each said kilowatt power transistor device including a thermally and electrically conductive flange, a multi-chip array formed of a four semiconductor dies, each said die having a flat lower surface with a drain formed over a majority of said lower surface, a source and a gate formed respectively on portions of the die away from said flat lower surface, and means for seating the drains of the dies in direct thermal and electrical contact with said flange so that said flange serves as drain terminal and as heat sink for said dies; first splitter means coupled to said RF input terminal for splitting an RF input drive signal into a forward phase portion and a reverse phase portion; second splitter means for splitting said forward phase portion of the drive signal into a plurality of isolated signals for supplying to the gates of said first kilowatt power transistor device; third splitter means for splitting said reverse phase portion into a plurality of isolated signals for supplying to the gates of said second kilowatt power transistor device; for each of said semiconductor die of said first kilowatt power transistor device a respective gate-source input circuit which is RF coupled to an associated output of said second splitter means and which is floating with respect to the flange of said first kilowatt power transistor device; for each said semiconductor die of said second kilowatt power transistor device a respective gate-source input circuit which is RF coupled to an associated output of said third splitter means but is floating with respect to the flange of said second kilowatt power transistor device; combiner means having inputs coupled to the sources of said first and second kilowatt power transistor devices for combining amplified RF outputs therefrom to supply an amplified RF signal to said RF output terminal; a supply of DC source voltage; and DC feed means connecting the sources of said kilowatt power transistor devices to said supply of DC voltage, said DC feed means including choke means for blocking said amplified RF signal from said supply of DC voltage, and means for bypassing RF energy, wherein the four dies of each said kilowatt power transistor device are paralleled externally, and are DC matched so that their gate-source thresholds are matched to within 0.2 volt, their drain-source on resistances are matched within 8%, and their forward transconductances are within 1 Siemans.

18. The high power RF amplifier of claim 17, wherein the four dies for each said kilowatt power transistor device are selected from adjacent wafer locations on the same semiconductor wafer, to ensure that there is good temperature and current tracking between the four dies.

19. The high power RF amplifier of claim 17, wherein said first and second kilowatt power transistor devices have their groups of four dies selected from adjacent chip locations of a single semiconductor wafer, to ensure there is good temperature and current tracking from one of said kilowatt power transistor devices to the other.

20. The high power RF amplifier of claim 19, wherein the difference in average RF gain between the first and second kilowatt power transistor devices is within about 0.5 dB.

21. The high power RF amplifier of claim 19, wherein the difference in RF efficiency between the first and second kilowatt power transistor devices is within about 1%.

22. The high power RF amplifier of claim 17, wherein said first splitter means is directly coupled to the second splitter means and the first kilowatt power transistor device, and is inductively coupled to the third splitter means and the second kilowatt power transistor device; and the first kilowatt power transistor device has an average gate threshold higher than that of the second kilowatt power transistor device.

23. The high power RF amplifier of claim 22, wherein the average gate threshold of the first kilowatt power transistor device is about 0.2 to 0.4 volt higher than that of the second kilowatt power transistor device.

24. The high power RF amplifier of claim 17, wherein the dies of each of said first and second kilowatt power transistor devices each have a respective series gate input resistor of about 1 to 2 ohms.

25. The high power RF amplifier of claim 17, wherein the dies of each of said first and second kilowatt power transistor devices each have a respective input RF termination between its gate and its source, the input RF terminations each being formed of a series resistor-capacitor combination.

26. The high power RF amplifier of claim 17, wherein the dies of each of said first and second kilowatt power transistor devices each have a respective DC termination resistor between its source and its gate, the DC termination resistor having a value on the order of 30 to 40 kilohms.

27. The high power RF amplifier of claim 17, wherein the dies of each of said first and second kilowatt power transistor devices each have a respective source-drain RF feedback circuit, each said RF feedback circuit being formed of a resistor-capacitor series combination, with a resistance value on the order of 400 to 560 ohms.

28. The high power RF amplifier of claim 17, wherein the sources of each of said kilowatt power transistor devices are direct coupled in parallel to said combiner means.

29. The high power RF amplifier of claim 28, wherein said combiner means includes an output balun transformer having an interface impedance of 18 ohms.

30. The high power RF amplifier of claim 17, further comprising, for each of said first and second kilowatt power transistor devices, a resonator circuit for dynamically compensating for the combined source-drain output capacitances of the dies of the respective kilowatt power transistor device; said resonator circuit including a series inductor-capacitor combination between source and ground to permit resonant circulating RF current to flow therein.

31. The high power RF amplifier of claim 17, wherein said DC feed means includes for each said first and second kilowatt power transistor device a respective inductor-capacitor combination, including a series inductor between said supply and the sources of said respective kilowatt power transistor device, and a parallel combination of an RF capacitor and a low frequency bypass capacitor.

32. The high power RF amplifier of claim 29, wherein the impedance of the output balun transformer is matched from 18 ohms to 50 ohms, with one of a single 3:5 turn ratio transformer or a pair of 2:3 turn ratio transformers, within a VSWR of less than 1.25:1.

33. The high power RF amplifier of claim 17, further comprising a low pass/high pass diplexer filter arrangement situated between said combiner means and said RF output terminal for reducing harmonic distortion and providing a dissipative harmonic termination; It reduces the gate-to-source different RF voltage and protects the MOSFETS from damage.

* * * * *